United States Patent [19]
Berry et al.

[11] Patent Number: 6,022,796
[45] Date of Patent: Feb. 8, 2000

[54] GEOMETRICAL CONTROL OF DEVICE CORNER THRESHOLD

[75] Inventors: Wayne S. Berry, Essex Junction, Vt.; Juergen Faul, Wappingers Falls, N.Y.; Wilfried Haensch, South Burlington; Rick L. Mohler, Williston, both of Vt.

[73] Assignees: International Business Machines Corporation, Armonk, N.Y.; Siemens Aktiengesellschaft, Munich, Germany

[21] Appl. No.: 09/120,190

[22] Filed: Jul. 22, 1998

Related U.S. Application Data

[62] Division of application No. 08/753,234, Nov. 22, 1996, Pat. No. 5,858,866.

[51] Int. Cl.[7] .................... H01L 21/3205; H01L 21/336
[52] U.S. Cl. ...................... 438/589; 438/197; 438/299; 438/770
[58] Field of Search .................... 438/589, 299, 438/301, 306, 296, 424, 221, FOR 363, 787, 197, 770

[56] References Cited

U.S. PATENT DOCUMENTS

| | | | |
|---|---|---|---|
| 4,538,343 | 9/1985 | Pollack et al. | 438/297 |
| 4,863,562 | 9/1989 | Bryant et al. | 438/445 |
| 4,923,821 | 5/1990 | Namose | 438/425 |
| 4,943,537 | 7/1990 | Harrington, III | 438/217 |
| 5,047,356 | 9/1991 | Li et al. | 438/154 |
| 5,122,474 | 6/1992 | Harrington, III | 438/217 |
| 5,130,268 | 7/1992 | Liou et al. | 438/425 |
| 5,206,535 | 4/1993 | Namose | 257/519 |
| 5,236,861 | 8/1993 | Otsu | 438/444 |
| 5,242,853 | 9/1993 | Sato et al. | 438/424 |
| 5,258,332 | 11/1993 | Horioka et al. | 438/389 |
| 5,387,540 | 2/1995 | Poon et al. | 438/585 |
| 5,459,096 | 10/1995 | Venkatesan et al. | 438/427 |
| 5,578,518 | 11/1996 | Koike et al. | 438/426 |

FOREIGN PATENT DOCUMENTS

| | | |
|---|---|---|
| 63-289871 | 11/1988 | Japan . |
| 2-271624 | 3/1990 | Japan . |

OTHER PUBLICATIONS

"Optimized Shallow Trench Isolation Structure and its Process for Eliminating Shallow Trench Isolation–Induced Parasitic Effects", IBM Technical Disclosure Bulletin, vol. 34, No. 11, Apr. 1992, pp. 276–277.

*Primary Examiner*—Michael Trinh
*Attorney, Agent, or Firm*—Whitham, Curtis & Whitham; Howard J. Walter

[57] ABSTRACT

Corner conduction in a conduction channel of a field effect transistor is controlled by the geometrical configuration of the gate oxide and gate electrode at the sides of the conduction channel. Rounding the corners of the conduction channel or forming depressions at edges of trench structures such as deep or shallow trench isolation structures and/or trench capacitors develop recesses in a surface of a substrate at an interface of active areas and trench structures in which a portion of the gate oxide and gate electrode are formed so that the gate oxide and gate electrode effectively wrap around a portion of the conduction channel of the transistor. Particularly when such transistors are formed in accordance with sub-micron design rules, the geometry of the gate electrode allows the electric field in the conduction channel to be modified without angled implantation to regulate the effects of corner conduction in the conduction channel. Thus the conduction characteristic near cut-off can be tailored to specific applications and conduction/cut-off threshold voltage can be reduced at will utilizing a simple, efficient and high-yield manufacturing process.

4 Claims, 5 Drawing Sheets

GEOMETRICAL CONTROL OF DEVICE CORNER THRESHOLD

This is a divisional application of application Ser. No. 08/753,234 filed on Nov. 22, 1996, now U.S. Pat. No. 5,858,866 entitled Geometrical Control of Device Corner Threshold.

BACKGROUND OF THE INVENTION

1. Field of the Invention

The present invention generally relates to the manufacture of field effect transistors and, more particularly, to the development of desired conduction/cut-off voltage in sub-micron field effect transistors.

2. Description of the Prior Art

Field effect transistors have become the active electronic element of choice for the majority of digital electronic circuits formed at small size and high integration density. The basic principle of operation of field effect transistors is to use a voltage applied to a gate electrode insulated from the conduction channel of the device to develop an electric field which controls the population of carriers in a body of semiconductor material which forms the conduction channel of the device. The simplicity of the structure forming a field effect transistor leads to high manufacturing yields and relatively lower process costs. Further, device simplicity allows device fabrication at extremely small sizes, allowing improvement in signal propagation time, noise immunity, load capacitance and other electrical parameters as well as substantial flexibility in device and isolation structure design and economy of fabrication since more circuits may be formed on a single wafer or chip.

Additionally, the simplicity of field effect transistor geometries allows the transistors to be tailored to many specific purposes and applications. For example, low thresholds and increased on-currents can be developed by doping of the conduction channel. Alternatively, thresholds may be maintained at higher levels in, for example, dynamic memory arrays. Short channel effects can be largely avoided by so-called lightly doped drain structures, and the like.

However, the electrical field developed within the conduction channel may not be uniform, particularly at the lateral edges (generally referred to as "corners") of the conduction channel which generally coincides with the periphery of the gate electrode. The conduction characteristics at the corners of the channel (referred to hereinafter as corner conduction) may therefore be quite different from those of the central portion of the channel (referred to hereinafter simply as channel conduction). Therefore, a rigorous analysis of a field effect transistor would include an equivalent circuit of two parallel-connected field effect transistors having different conduction/cut-off thresholds.

The planar or channel portion of the transistor generally dominates the on-current characteristics of the transistor and, in relatively larger (e.g. wider channel) devices, the field can be considered as relatively uniform throughout the conduction channel. Consequently, device characteristics, such as conduction/cut-off threshold Vt, of particular interest in digital circuits, are highly predictable. However, so-called off-current occurs principally in the corners of the conduction channel, even in wide devices, and, in practical effect (particularly for digital devices) appears as a different conduction/cut-off threshold voltage. Conduction in the corners of the channel may also contribute significantly to the on-current of the transistor, as is exploited in so-called multi-mesa transistor designs.

As field effect transistors are made smaller, the conduction effects at the corners of the conduction channel become relatively more significant and, in fact, may become dominant at sub-micron channel widths. The practical effect of corner conduction as it becomes comparable to channel conduction is to relatively increase the off-current of the transistor while providing some increase in on-current or to "soften" the conduction characteristic near the cut-off voltage. If corner conduction is dominant, the effect is an increased conduction/cut-off threshold, $V_t$.

Additionally, increased variance of conduction/cut-off threshold has been observed as device size decreases in the sub-micron regime where very small differences in channel dimensions may greatly affect the relative contributions of corner and channel conduction of transistors. While threshold voltages will generally be quite uniform across a wafer or chip for transistors of a similar size (although more critical at smaller sizes) it is common for complementary transistors (e.g. CMOS) to be fabricated at different sizes to increase symmetry of conduction currents and different thresholds developed from differences in transistor size may severely compromise the intended switching symmetry in a manner which is somewhat unpredictable and not readily correctable in device design or fabrication.

Particularly for application to digital circuits and low power CMOS logic, it is desirable to minimize off-current while maximizing on-current. As the off-current effects increase with increasing corner conduction contribution, the ratio of on-current to off-current is reduced. Further, differing thresholds between interconnected chips may effectively decrease operating margins. "Softening" of the cut-off characteristic near the threshold voltage, $V_t$, and/or increase of the threshold voltage is also particularly undesirable in digital circuits.

Since the corner conduction results from non-uniformity of the electric field within the channel, it may be possible to adjust the electric field by performing an angled impurity implantation in the conduction channel region. However, implantation causes crystal lattice defects in the semiconductor material which cannot be fully repaired by annealing consistent with the adjustment of electrical field which would be necessary. Normal channel conduction characteristics may also be altered by impurity implantation. Angled implantation is also a complex and difficult process which is likely to result in some degree of non-uniformity between devices, even as formed on the same wafer. For these and a variety of related reasons, manufacturing yield is relatively reduced when angled implantation is employed. In any event, it is not clear that angled implantation would provide a suitable adjustment of electric field within the conduction channel, particularly as channel width is reduced.

SUMMARY OF THE INVENTION

It is therefore an object of the present invention to provide a technique of adjustment of corner conduction in a field effect transistor which is independent of the channel conduction.

It is another object of the invention to provide a field effect transistor and a high-yield method for its manufacture in which the conduction threshold and off-current may be adjusted to desired values.

It is a further object of the invention to provide a field effect transistor and method of manufacture which allows the conduction/cut-off voltage to be adjusted at will.

It is yet another object of the invention to provide a transistor structure which is scalable to sub-micron sizes while maintaining a well-defined conduction/cut-off threshold voltage and conduction characteristic.

In order to accomplish these and other objects of the invention, a field effect transistor and integrated circuit including the same are provided having a conduction channel formed in an active area bounded by trench structures, a gate oxide and a gate electrode formed on the conduction channel, and a portion of the gate oxide and gate electrode extending along a portion of a side of the conduction channel at an interface of the conduction channel and the trench structures.

In accordance with another aspect of the invention, a method of manufacturing a semiconductor device including a field effect transistor is provided comprising the steps of forming a sacrificial oxide at a surface of an active area of a substrate and at an interface between the active area and a trench structure, removing the sacrificial oxide to form a recess in the substrate, and forming a gate oxide and a gate electrode over the active area and in the recess.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
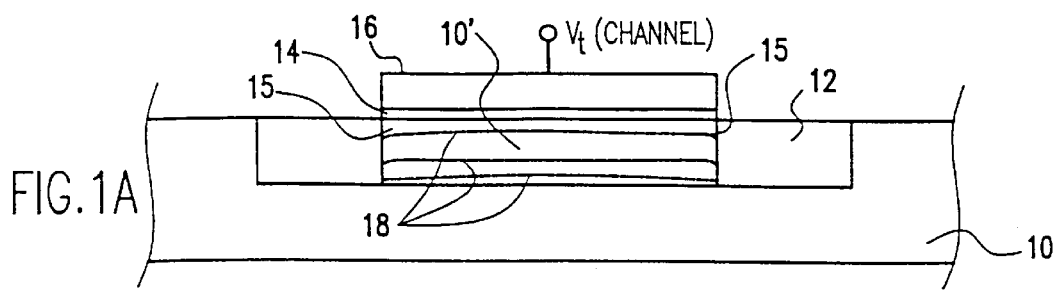
FIGS. 1a and 1b are cross-sectional views of a field effect transistors showing electric field profiles leading to corner conduction.

Referring now to the drawings, and more particularly to FIG. 1a, there is shown, in cross-section, a schematic representation of a field effect transistor including equipotential electric field lines within the conduction channel at a gate voltage near the conduction/cut-off threshold of the transistor. The transistor depicted in FIG. 1a has a conduction channel 10' of relatively large width in substrate 10 between, for example, shallow trench isolation structures 12 and below gate oxide 14 and gate electrode 16. If a gate electrode voltage $V_{t(channel)}$ sufficient to turn-off of main channel conduction, is applied to gate electrode 16, the electric field within the conduction channel 10' will be substantially uniform as depicted by equipotential lines 18. It should be noted, however, that some non-uniformity of electric field is present at the corners of the conduction channel, indicated by reference numeral 15. Thus at a gate electrode voltage of $V_{t(channel)}$, the electric field will continue to allow some conduction in the corners of the channel but which may be an insignificant contribution to conduction of the transistor.

Figure 1B:
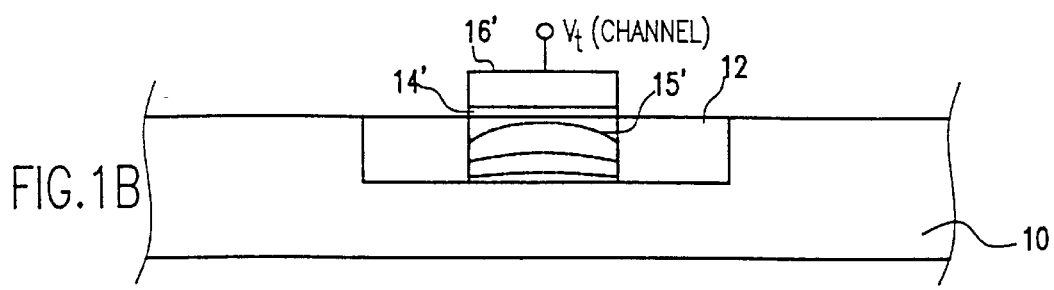

However, in a narrow (e.g. sub-micron) width channel, as depicted in FIG. 1b (particularly by the depiction of the gate oxide 14', gate 16' and shallow trench isolation 12 being of the same, presumably minimum feature sized area), it can be seen that the field lines 18' allow corner conduction in a proportionally larger fraction of the cross-section of the conduction channel. Therefore, the corner conduction presents a proportionally larger contribution to transistor conduction or, conversely, a larger $V_t$ would be required to adequately turn off the transistor. This effect is proportionally increased as the channel width is decreased.

It should also be appreciated from FIGS. 1a and 1b that adjustment of the location of the equipotential lines to be more exactly horizontal by altering dopant concentration profile would require angled implantation from both sides of the channel as well as an altered (e.g. non-linear) dopant concentration across the channel width. The non-linear profile is difficult to obtain and/or regulate and the implantation from both sides requires plural process steps. Further, such angled implantation would probably require additional process steps for growth or deposition of oxide and annealing prior to completion of the isolation structures 12. In any event, the process is necessarily complex, difficult to regulate and maintain uniformity between wafers or on a single wafer and of less than optimal manufacturing yield.

Figure 2:
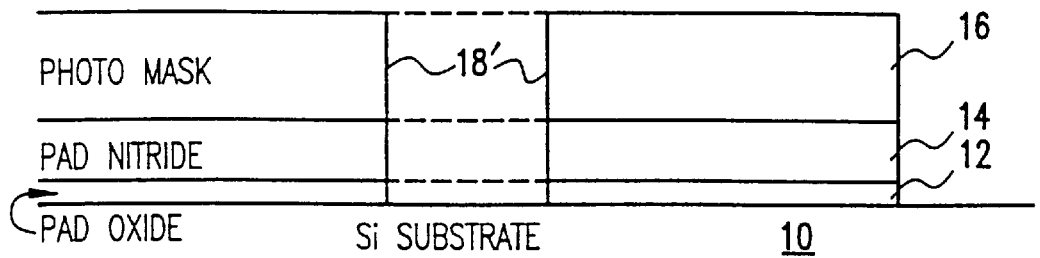
FIGS. 2, 3, 4, 5, 6, 7 and 8 are cross-sectional views of stages of fabrication of a field effect transistor in accordance with the invention.

Referring now to FIGS. 2–9 the structure and fabrication of a preferred form of the field effect transistor in accordance with the invention will now be explained. Specifically, FIG. 2 depicts an early stage of fabrication of a transistor and isolation structure in accordance with a preferred embodiment of the invention. It should be appreciated that the invention is particularly applicable to transistor structures which are separated by isolation structures which, in turn, allow transistors to be placed in close proximity. Therefore, it is to be understood that while FIGS. 2–9 show the formation of a single transistor, the invention is particularly applicable to formation of arrays of large numbers of transistors at high integration density, as is a preferred and particularly advantageous application of the invention.

It should also be understood that the structure formed in such a trench need not be an isolation structure. For example, the invention is equally applicable to formation of transistor arrays in combination with trench storage capacitor structures as are commonly employed in dynamic memory chips. Accordingly, while the invention will be described below in terms of the formation of a transistor in combination with an isolation structure including a trench for simplicity, other trench structures may be employed.

As shown in FIG. 2, a layer of pad oxide 12 and a layer of pad nitride 14 are sequentially formed by any known method on substrate 10. A trench mask is then formed by applying a layer of suitable resist 16 and patterning the resist lithographically as depicted at 18. Then, using the patterned resist as a mask, the pad nitride and pad oxide layers are similarly patterned by any suitable known etching method and etchant.

Figure 3:
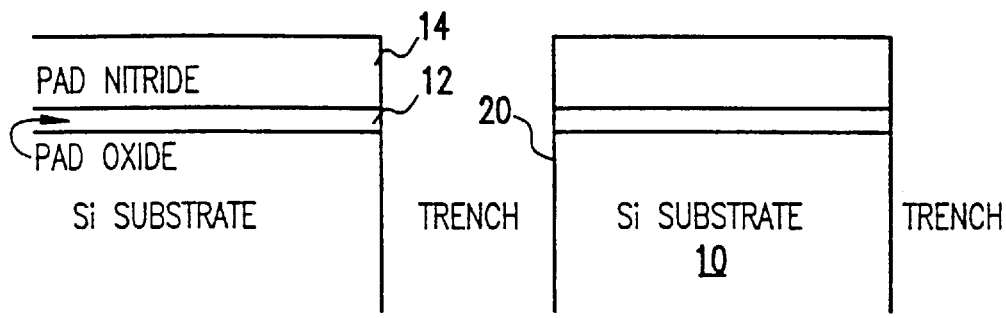

Then, as shown in FIG. 3, a trench is etched in the silicon substrate 10 using the patterned pad nitride layer as a mask. It should be understood in this regard that while a silicon-based metallurgy is preferred for practice of the invention and the invention will be described in connection therewith, use of other materials in accordance with the principles of the invention will be evident to those skilled in the art in view of this description of the invention. Further, it should be understood that the depth of the trench is not at all critical to the practice of the principles of the invention but trench depth should be designed in accordance with the type of isolation structure to be formed and the desired properties thereof, in which trench depth may, indeed, be critical. However, such design considerations will be evident to those skilled in the art and need not be discussed further to enable practice of the invention.

Figure 4:
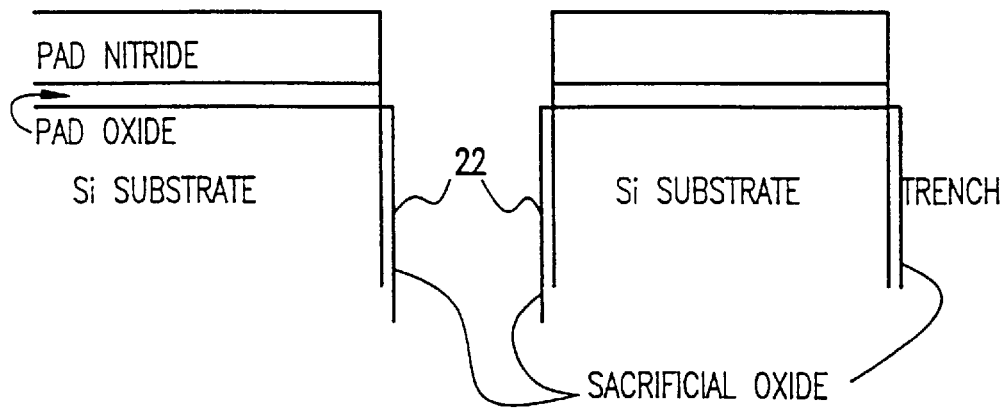

Referring now to FIG. 4, a sacrificial oxide layer 22 (which will be referred to hereinafter as a trench sacrificial oxide) is formed on the silicon surface exposed on the interior of the trench in substrate 10. This layer is preferably grown by, for example, thermal oxidation in order to limit oxide layer formation to the exposed silicon in the trench to simplify the following etching process illustrated in FIG. 5.

Specifically, the trench sacrificial oxide is subjected to an isotropic etch process such as wet etching using dilute (e.g. 40:1) buffered hydrofluoric acid (HF) or any other suitable process which is both substantially isotropic and selective between oxide and the substrate material (and, preferably, the pad nitride layer 14). Thus, as the trench sacrificial oxide 22 is etched, the pad oxide layer 12 will also be etched to undercut the pad nitride layer. (In theory, if the etch is sufficiently selective, the trench sacrificial oxide could be omitted and the pad oxide etched directly. However, the use of a trench sacrificial oxide is preferred to protect the silicon under a wider variety of etch processes, removal of residual surface contaminants from the trench, particularly when a storage capacitor or other structure is to be formed therein rather than the simple trench isolation depicted, and, possibly, to allow monitoring of the progress of the etching process to improve accuracy of the extent of the undercut.) It should be appreciated that the isotropic etching of the pad oxide layer exposes the corner of the active area in which the transistor is to be formed and the extent of the undercut of the pad nitride layer 14 is important to the development of particular corner rounding geometry as will be described below with reference to FIG. 8 and the generalized embodiment of FIGS. 11–13.

Figure 6:
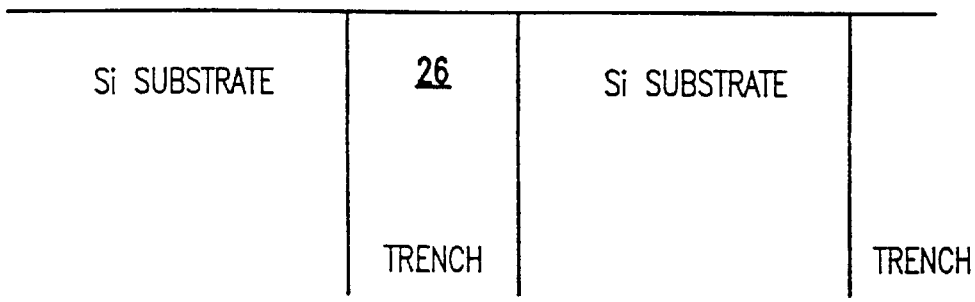

Referring now to FIG. 6, the trenches 20 are filled with suitable insulating material 26 such as an oxide, composite or layered structure, as may be desired or required by the overall device design (but of no importance to the practice of the principles of the invention) by any suitable deposition or growth process or combination thereof using the patterned nitride layer 14 as a mask. After filling of the trenches to complete the isolation structures, storage capacitors or the like, the pad nitride layer may be removed.

It is preferred that the process for removal of the nitride pad layer 14 allows the remainder of the pad oxide layer 12, after the undercut is accomplished, to remain in place. This remaining pad oxide allows control of rounding of the corners of the active areas in which the transistors will be fabricated. The achievement of the rounding of the corners of the active area in connection with the preferred embodiment of the invention will be discussed in greater detail below with reference to FIG. 14. However, it is to be understood that control of $V_t$ in accordance with the invention can be achieved without rounding of the corners of the active areas by forming depressions in the isolation structures adjacent the active areas and, for clarity of explanation of the formation of such depressions, the remainder of pad oxide layer 12 is not shown in FIG. 6. Nevertheless, it is preferred that the invention be practiced using a combination of the formation of depressions and rounding of the corners of the active areas although the invention may be practiced by either rounding of the corners of the active area or the formation of depressions in the isolation structure to the exclusion of the other or in combination in any relative degree.

Figure 7:
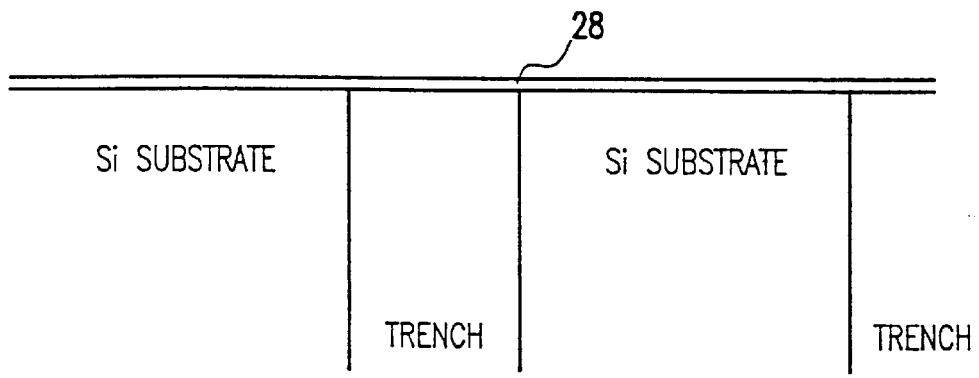

Referring now to FIG. 7, a further sacrificial oxide (referred to hereinafter as a surface sacrificial oxide) 28 is deposited as a blanket layer or grown by, for example, thermal oxidation. In the latter case, the grown oxide will be principally formed on the active areas in a manner advantageous to developing desired corner geometry of the gate oxide and electrode as will be discussed below with reference to FIG. 14. (Again, oxide is strongly preferred for process convenience and minimization of process steps but other materials could be used.) A combination of oxide growth followed by blanket oxide layer deposition may also develop selected differences in thickness of oxide layer 28 in much the profile illustrated in order to exercise even more control over the corner geometry.

Figure 8:
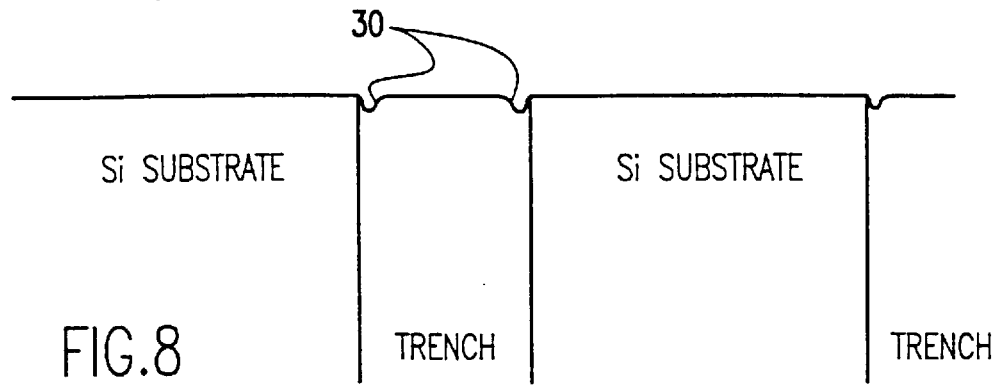

As shown in FIG. 8, the surface sacrificial oxide can now be etched by any process which is largely selective between the surface sacrificial layer 28 material and the substrate 10 material. The etch process serves to both provide for the removal of surface contaminants and to develop control or gate electrode geometry in accordance with the invention. The etch process is preferably continued somewhat beyond the point at which the surface of the silicon in the active areas is exposed to develop depressions 30 at the edges of the isolation trenches. The formation of these depressions 30 may be facilitated by the production of internal stresses in grown oxide at the interface between the active area portion of the substrate and the trench material since the grown oxide is of greater volume than the silicon prior to oxidation. The extent of the depressions 30 determines the dimensions of gate electrode wrap-around along the sides of the conduction channel which has been found to be very predictably determinative of threshold voltage of the transistor in accordance with the invention as will be discussed more fully below in connection with FIG. 10.

Figure 9:
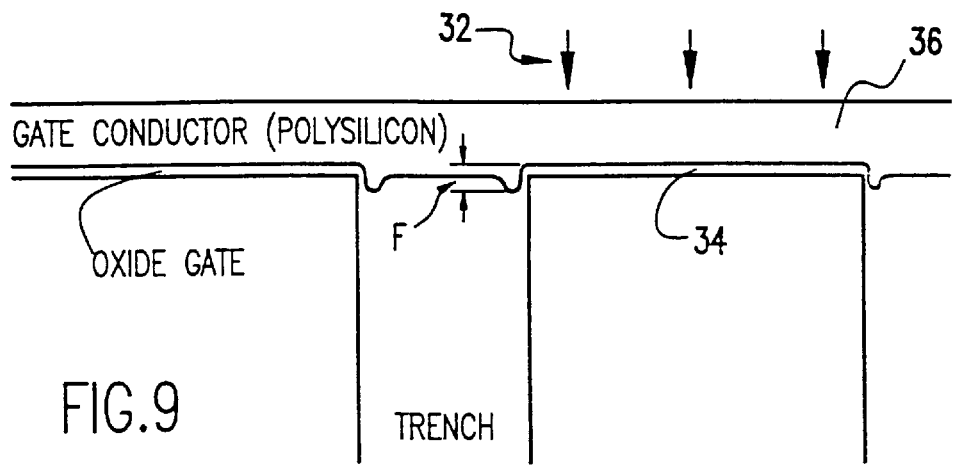
FIG. 9 shows a cross-sectional view of a completed transistor in accordance with the invention, FIG. 10 graphically depicts the relationship of threshold and gate electrode wrap-around in accordance with the invention.

The transistor may then be completed as shown in FIG. 9 by implantation 32, formation of a thin gate insulator (e.g. oxide, nitride, composite or layered structure) 34 and the deposition and patterning of gate electrode 36 of either metal or polysilicon. Again, particularly if the gate oxide is formed by thermal oxidation, the oxide will form principally on the exposed silicon and will not affect the geometry of depressions 30. Even if deposited, the thin gate insulator layer 34 will be highly conformal and will substantially preserve the geometry of depressions 30. However, in the latter case, deposition by a method of known character as to relative degree of isotropy and anisotropy can be used, if desired, to subtly tailor the wrap-around geometry as may be found advantageous. However, as will now be explained, the dimension, F, bears the most important effect on transistor threshold.

Figure 10:
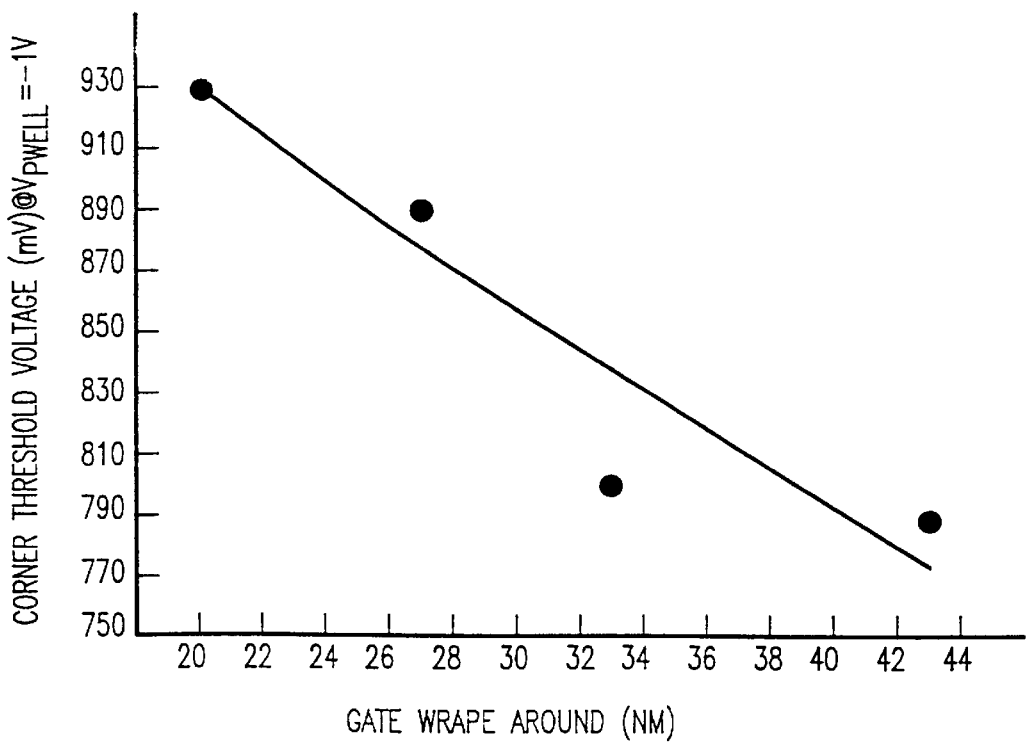

Specifically, as shown in FIG. 10, the conduction/cut-off threshold $V_t$ of the resulting transistor is plotted (in millivolts) as a function of the control gate wrap around distance F (in nanometers). As can be seen, the threshold $V_t$ is reduced in a substantially linear fashion as dimension F increases. It appears that this relationship can be extrapolated to greater dimensions of control gate wrap-around than is represented in FIG. 10 although it is to be expected that a limit on threshold reduction will exist due to other properties of the design of a particular transistor and, in any event, reduction of threshold beyond about 0.4 volts would be of limited, if any, utility in a logic circuit.

Figure 11:
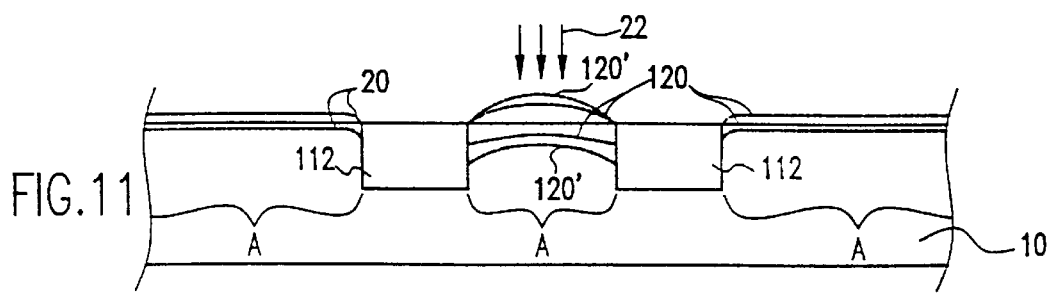
FIGS. 11, 12 and 13 are cross-sectional views illustrating a generalization of the preferred process illustrated in FIGS. 2–9 in accordance with the invention.

While a preferred form of the manufacturing process for the transistor in accordance with the invention has been provided above, an alternative process may be used as will now be discussed in connection with FIGS. 11–13 and which will serve as a generalization of variations of the process in accordance with the invention which may be exploited to advantage in achieving the above-noted objects thereof. Specifically, FIG. 11 shows, in cross-section, an early stage in fabrication of the transistor in which active areas A have been defined by the formation of isolation structures 112 which separate them. As is well-understood in the art, such isolation structures may take many forms (e.g. shallow trench, deep trench, recessed oxide and the like as well as other structures employing a trench, such as storage capacitors) and are generally composed of oxide and employed where particularly high integration density is desired. Other insulating materials may be employed but oxide is preferred for the practice of the invention, particularly where the substrate 10 is silicon. However, other substrate materials such as germanium, and other insulating materials may be employed such as nitride or oxide and nitride may be employed, as desired, within the principles of the invention.

The first step in the fabrication of the transistor in accordance with the invention from the structure shown in FIG. 11 is the growth of thermal oxide as shown by dashed lines 120 or 120'. Various techniques of thermal oxide growth are well-understood in the art and the particular technique chosen is not critical to the practice of the invention. It should also be understood that other compounds (e.g. nitride) of the material of substrate 10 could be used within the principles of the invention and the use herein of the term "oxide" is intended to indicate preference therefor while being generic to other possible compounds or materials). However, it is important to an understanding of the invention to note that the thermal oxide grows substantially only on the active areas and at the interface of an active area with an isolation structure. Thus, the thermal oxide will principally be formed at the corners of the active area and, when the active area is very narrow, the oxide interface with the surface of the active area will assume a curved profile as indicated, for example, by dashed lines 120 and produce curvature of the corners or the entire active area when the oxide is removed.

The thermally grown (or deposited) oxide is referred to as a sacrificial oxide since it will be removed in later process steps and its quality and thickness are not particularly important to the practice of the invention. However, if the oxide is grown, the curved profile of oxide at the corner may be altered at will by the temperature at which the oxide is grown. Specifically, higher temperatures enhance the diffusion of oxygen into the silicon from either the atmosphere and/or the isolation oxide structures and will result in increased curvature of the oxide corner profile as depicted by dashed lines 120'. Further, while the oxide is present, it can be beneficially utilized to moderate any implantation (depicted at 22) into the channel region which may be desired or required by device design. The removal of the oxide also provides freedom from surface contamination of the underlying silicon when the critical and extremely thin gate oxide 140 (FIG. 13) is grown.

Figure 12:
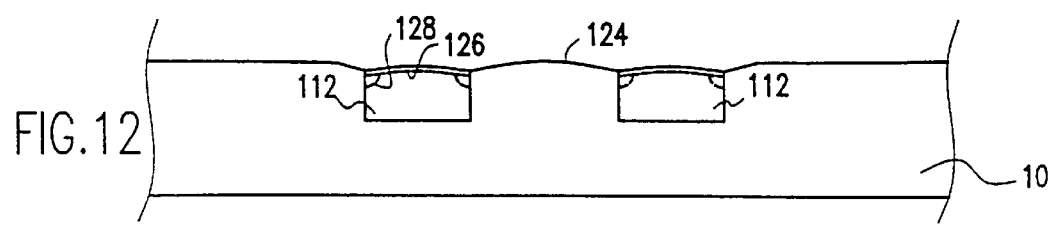

Referring now to FIG. 12, after processes which can be facilitated by the sacrificial oxide 120 have been completed, the sacrificial oxide is removed by any etching process which is reasonably selective between the sacrificial (e.g. thermal) oxide and the substrate material resulting in a recess in the substrate having a curved profile 124 of exposed silicon at the corner of the active area. Many such processes and etchants are well-known and the choice of process and etchant are not critical to the practice of the invention. The selective removal of the oxide thus transfers the curved profile of the oxide to the corner of the active area.

It should be understood that the formation and removal of the sacrificial oxide from the active areas results in a curvature of the corners of the conduction channel which may be tailored to closely match the equipotential lines of FIGS. 1a and/or 1b. Such a structure also provides a topography of the gate oxide and electrode which includes a degree of "gate electrode wrap-around" including a dimension F' in much the same manner as described above for development of dimension F except that the wrap-around of the gate electrode will now be located within the active area rather than the isolation structure. As will be described more fully below, the invention may be practiced by rounding of the corners of the active area to the exclusion of any etching of the isolation structures. Further, tailoring of the corners of the channel to match the equipotential lines serves to maintain and possibly enhance the sharpness of the conduction characteristic of the transistor at $V_t$.

However, it should be realized that if the invention is practiced solely through rounding of the corners of the conduction channel, the cross-sectional area of the conduction channel is reduced and, perhaps more importantly, corner conduction is largely if not totally eliminated by removal of the corners of the channel. Therefore the corner conduction effects cannot significantly supplement the on-current of the device which is, in turn, limited by the reduced cross-sectional area of the channel. Further, since corner rounding is a function of the growth of thermal oxide which is limited by diffusion of oxygen in the silicon, the depth to which thermal oxide can be grown in an economically feasible period of time is limited and may not provide the desired degree of threshold voltage adjustment. On the other hand, the development of gate electrode wrap-around solely in the area of the trench structure may reduce breakdown voltage (depending on gate electrode structure and patterning) or increase capacitive coupling between transistors. Therefore, as indicated above, it is considered preferable to practice the invention using a combination of corner rounding within the active area and gate electrode wrap-around in the trench area.

To develop gate electrode wrap-around, if the isolation structure is of the same compound as the thermally grown material (e.g. oxide) or can be etched at a comparable rate, the etching process may be simply continued to overetch the isolation structures as shown by dashed line 126 in much the same manner as discussed above in connection with FIG. 8. (If the materials are different, the etchant or etching process or both should be changed, maintaining selectivity between the material of the isolation structures 112 and the material of substrate 10). Recessed regions 128 will also be formed since a greater etching rate will occur in regions where mechanical stress is present, as alluded to above. The depth to which formation of recessed regions 128 is carried out is important to control of the conduction threshold of the resulting transistors but, since usable thresholds can be made to vary, at will, over a wide range, the extent of the overetching of the isolation structure should not be considered critical to the practice of the invention.

Figure 13:
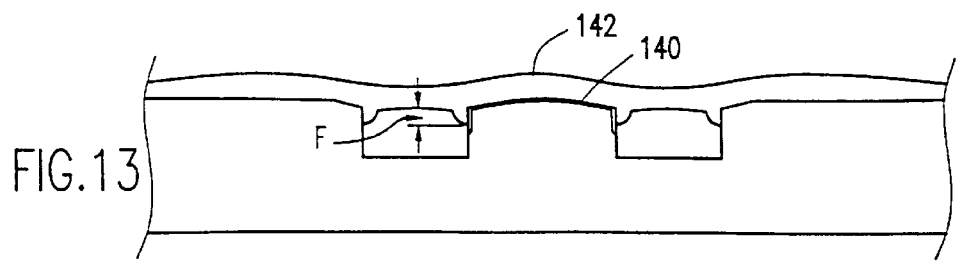

Once the desired degree of overetching has been completed, the thin gate oxide 140 may be deposited or, preferably, thermally grown as shown in FIG. 13. Then metal or doped semiconductor can be deposited and patterned to form gate electrodes 142 to complete the transistor.

It should be noted that between the embodiment discussed in regard to FIGS. 2–9 and the embodiment discussed in regard to FIGS. 11–13, that in the former (FIGS. 2–9), a depression is developed principally on the isolation structure while in the latter (especially FIGS. 11–12, prior to overetching depressions 128), a curved surface (generally approximating the equipotential lines 15' of FIG. 1b) is developed principally in the active area. These effects can be separately regulated in the practice of the invention but should be regarded as extremes of a continuum of shapes which may be developed by control of thickness of the surface sacrificial oxide, the undercut of the pad oxide and the width of the active area in accordance with the invention as described above as may be desired for a particular design as will now be described in detail with reference to FIG. 14.

Figure 5:
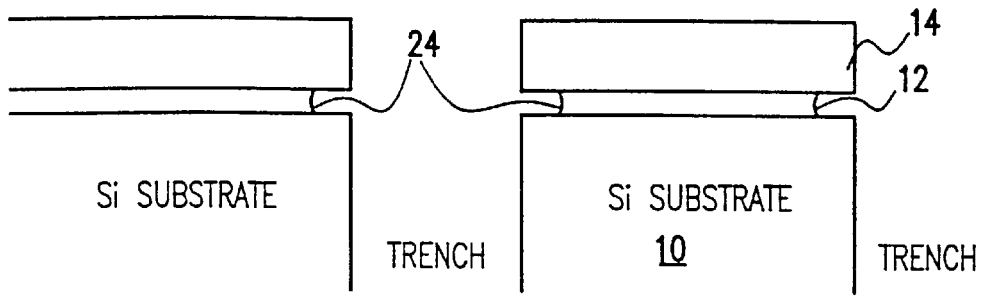
Figure 14:
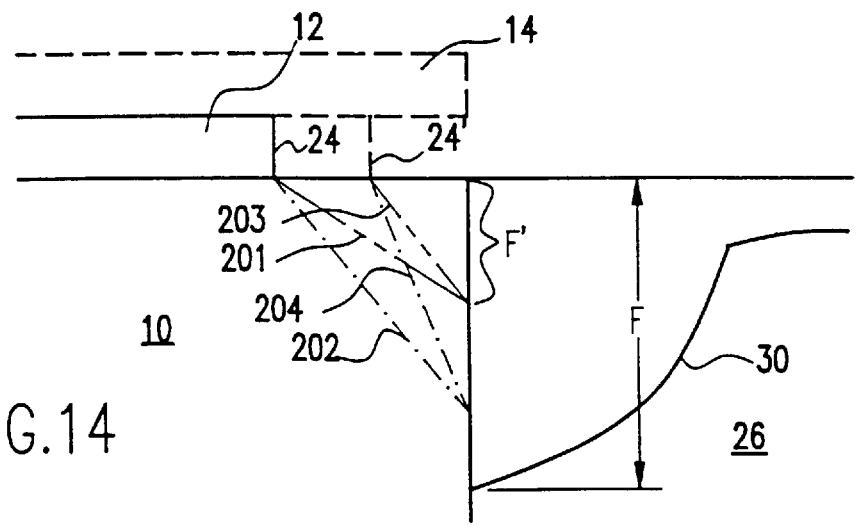
FIG. 14 illustrates a detail of the process described in conjunction with FIGS. 5 and 6 or FIG. 11, and FIG. 15 graphically depicts the relationship between threshold voltage and corner rounding profiles (in terms of etch time of a pad oxide layer) in accordance with the invention.

Specifically, FIG. 14 shows a corner of an active area as illustrated in FIG. 5 but after removal of the pad nitride layer 14, leaving a remaining portion of pad oxide layer 12 after the nitride layer 14 is undercut (e.g. 24) by generally isotropic and selective etching. Growth of thermal oxide at a given temperature will thus occur at the locations where the substrate material is exposed by the pad oxide 12 and at a greater rate proximate to the interface of the substrate 10 and the trench structure 26 resulting in the profile indicated at 201. As alluded to above, a higher temperature for thermal oxide growth will increase diffusion of oxygen and result in the thermal oxide profile indicated by chain line 202. Similarly, if the undercut is reduced (e.g. 24'), thermal oxide growth at the given temperature will result in the profile indicated by dashed line 203 and thermal oxide growth at the higher temperature will result in the profile indicated by the double-dot chain line 204. Thus, different combinations or sequences or both of masking and temperature(s) for thermal oxide growth allow substantial flexibility in the corner rounding profile which can be obtained.

Figure 15:
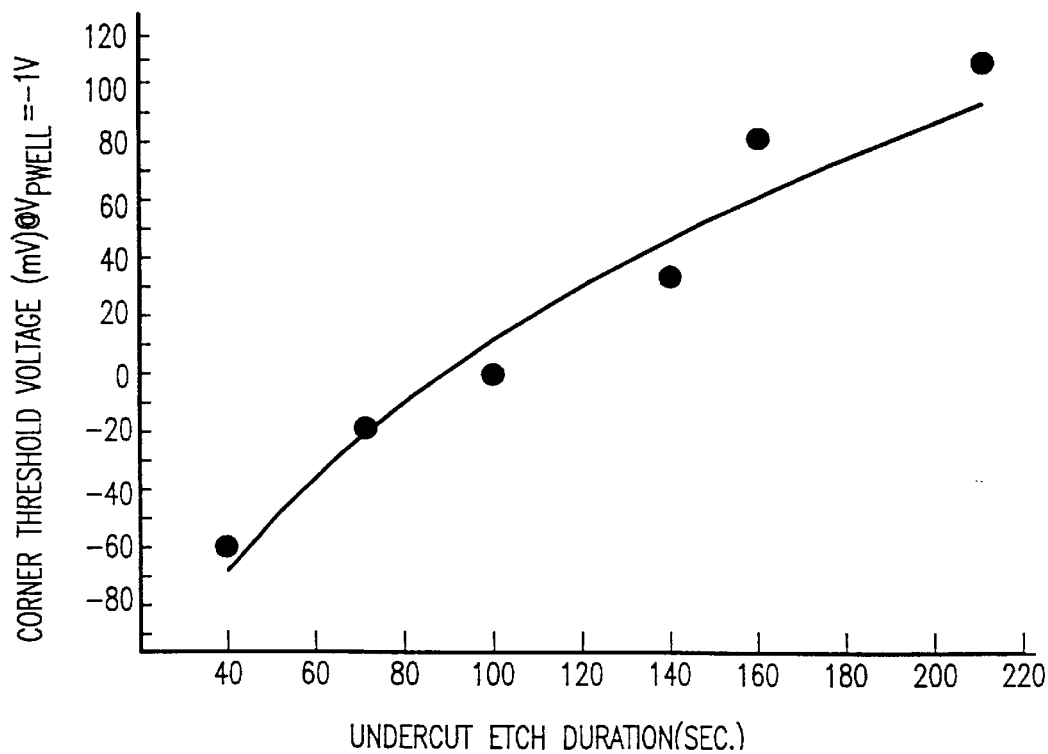

The effect on threshold voltage as a function of undercut is graphically depicted in FIG. 15. Specifically, in FIG. 15 the corner threshold voltage change (in millivolts) is plotted as a function of duration (in seconds) of the etching of the pad oxide 12 (and the sacrificial trench oxide 22) in a dilute (e.g. 40:1) buffered hydrofluoric acid wet etch followed by thermal oxide growth at a standard temperature. It should be understood that many factors such as temperature, etchant concentration, etch process and the like can effect etch rates and FIG. 15 depicts results of a plurality of processes carried out maintaining all such factors substantially constant except for duration of the wet etch. Therefore, for other processes and/or conditions, the horizontal scale of FIG. 15 should be considered as being in arbitrary units of time. Note also that since the vertical axis is scaled in units of threshold change, the location of the origin (0.0 mV change) is also arbitrary.

Thus, since a greater degree of undercut will result in a greater dimension of F' if all other conditions are maintained constant, it is seen that much the same gross effect is achieved as is shown for gate electrode wrap-around in FIG. 10. However, the effect on threshold voltage is somewhat non-linear and will have an effect which is more nearly specific to corner conduction effects and, hence, the shape of the conduction characteristic of the transistor near cut-off and the magnitude of the corner conduction component of on-current of the transistor. Therefore, while either corner rounding of the active area or gate electrode wrap-around could be used to the exclusion of the other in the practice of the invention, the use of both in varying relative degree provides substantial flexibility in tailoring threshold voltage, conduction characteristic near cut-off and on-current in the design of transistors for various applications.

For example, while FIG. 15 reflects some possible amount of non-linearity with time of the extent of the undercut, in combination with the changes in the electrical field produced by gate electrode wrap-around, the results depicted in FIG. 15 suggest that corner conduction can be engendered (e.g. by deliberate mismatch of the equipotential lines in the channel) when the transistor is conductive in order to enhance on-current while the cut-off threshold can be made arbitrarily low.

In view of the foregoing, it is seen that the invention provides a transistor structure and method of manufacture therefor which is simple, economical and of high yield and which provides for control of conduction/cut-off threshold and conduction characteristic, including on-current, by control of corner conduction as design rules are scaled into the sub-micron regime.

While the invention has been described in terms of a single preferred embodiment and variations thereon, those skilled in the art will recognize that the invention can be practiced with modification within the spirit and scope of the appended claims.

Having thus described my invention, what we claim as new and desire to secure by Letters Patent is as follows:

1. A method of manufacturing a semiconductor device including a field effect transistor, said method comprising the steps of:

forming trench isolation structures in a substrate of said semiconductor device, said trench isolation structures including insulation material forming therein and having surface substantially coplanar with said active area;

thermally oxidizing to form a sacrificial oxide at a surface of said active area of said substrate, said active area being substantially a conduction channel and being isolated from other active areas by said trench isolation structures, said sacrificial oxide layer further forming at a corner of said active area and said trench isolation structures and having a curved profile over an entire surface of said active area between adjacent said trench isolation structures;

etching said sacrificial oxide having a curved surface to form a rounded corner on said active area at the interface between said active area and said trench isolation structures; and forming a gate oxide and a gate electrode over said conduction channel and around said rounded corners of said active area, said rounded corners, said gate oxide and said gate electrode providing controlled threshold conduction characteristics in said conduction channel.

2. A method as recited in claim 1, where a portion of said sacrificial oxide is thermally grown.

3. A method as recited in claim 1, including the further step of implanting impurities in said active area of said substrate.

4. A method as recited in claim 1, wherein said isolation structure is a trench storage capacitor structure.

* * * * *